(12) United States Patent
Seo

(10) Patent No.: US 12,068,348 B2
(45) Date of Patent: Aug. 20, 2024

(54) IMAGE SENSOR PACKAGE WITH TRANSPARENT COVER PARTIALLY COVERED BY MOLD LAYER AND MANUFACTURING METHOD THEREOF

(71) Applicant: SAMSUNG ELECTRONICS CO., LTD., Suwon-si (KR)

(72) Inventor: Byoungrim Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 547 days.

(21) Appl. No.: 17/240,092

(22) Filed: Apr. 26, 2021

(65) Prior Publication Data
US 2022/0123038 A1 Apr. 21, 2022

(30) Foreign Application Priority Data
Oct. 19, 2020 (KR) .......................... 10-2020-0134953

(51) Int. Cl.
*H01L 27/146* (2006.01)
*H04N 23/54* (2023.01)
*H04N 25/70* (2023.01)

(52) U.S. Cl.
CPC .... *H01L 27/14625* (2013.01); *H01L 27/1462* (2013.01); *H04N 23/54* (2023.01); *H04N 25/70* (2023.01)

(58) Field of Classification Search
CPC ............. H01L 27/146; H01L 27/14625; H01L 27/1462; H01L 27/14627; H01L 27/14621; H01L 27/14618; H01L 24/48; H01L 27/14636; H04N 23/54; H04N 25/70; H04N 23/57
See application file for complete search history.

(56) References Cited

U.S. PATENT DOCUMENTS 5,949,655 A * 9/1999 Glenn ...................... H01L 23/04
257/E29.022
6,566,745 B1 5/2003 Beyne et al.
8,034,652 B2 10/2011 Nishida et al.
(Continued)

FOREIGN PATENT DOCUMENTS

EP 1560270 A2 * 8/2005 ....... H01L 27/14618
KR 10-0724194 5/2007
(Continued)

*Primary Examiner* — John P. Dulka
(74) *Attorney, Agent, or Firm* — F. CHAU & ASSOCIATES, LLC

(57) ABSTRACT

An image sensor package includes a substrate and an image sensor on the substrate. An adhesive film is on the image sensor. A transparent cover is on the adhesive film. The transparent cover includes a top surface, a first side surface and a second side surface disposed on the first side surface. The second side surface is inclined with respect to an extending direction of a bottom surface of the transparent cover. A mold layer covers an upper surface of the substrate, a side surface of the image sensor, a side surface of the adhesive film, the first side surface of the transparent cover and a partial portion of the second side surface of the transparent cover. A top surface of the mold layer is higher than a lower end of the second side surface and lower than the top surface of the transparent cover.

18 Claims, 14 Drawing Sheets

(56) References Cited

U.S. PATENT DOCUMENTS

| | | | |
|---|---|---|---|
| 8,890,269 B2 | 11/2014 | Luan | |
| 10,008,533 B2* | 6/2018 | Jun | H01L 24/97 |
| 2006/0145325 A1 | 7/2006 | Yang et al. | |
| 2009/0046183 A1 | 2/2009 | Nishida et al. | |
| 2013/0320471 A1 | 12/2013 | Luan | |
| 2018/0332245 A1 | 11/2018 | Mishima | |
| 2020/0161351 A1* | 5/2020 | Tan | H01L 27/14618 |
| 2023/0098224 A1* | 3/2023 | Shim | H01L 27/14636 |
| | | | 257/434 |

FOREIGN PATENT DOCUMENTS

| | | |
|---|---|---|
| KR | 10-1666599 | 10/2016 |
| KR | 10-2019-0034835 | 4/2019 |

* cited by examiner

IMAGE SENSOR PACKAGE WITH TRANSPARENT COVER PARTIALLY COVERED BY MOLD LAYER AND MANUFACTURING METHOD THEREOF

CROSS-REFERENCE TO RELATED APPLICATIONS

This application claims priority under 35 U.S.C. 119 to Korean Patent Application No. 10-2020-0134953, filed on Oct. 19, 2020 in the Korean Intellectual Property Office, the disclosure of which is incorporated herein by reference in its entirety herein.

TECHNICAL FIELD

The present inventive concepts relate to an image sensor package and a manufacturing method thereof.

DISCUSSION OF RELATED ART

In an image sensor molded ball grid array (ImBGA) packaging process, an image sensor is mounted to a separate printed circuit board (PCB), and a wire bonding process, a glass attachment process, and a molding process are then performed. In such an ImBGA packaging process, there is a high possibility that mold flash may be created, or foreign matter, scratches, etc. may be produced on a surface of glass during the molding process. In addition, when a thermal process according to surface mount technology (SMT) is performed, failures, such as interface peel-off, may be generated between the glass and the mold due to air expansion.

SUMMARY

Embodiments of the present inventive concepts provide an image sensor package including a finished transparent cover.

Embodiments of the present inventive concepts provide a method for manufacturing an image sensor package using a transparent cover formed with a coating layer.

According to an embodiment of the present inventive concepts, an image sensor package includes a substrate and an image sensor on the substrate. An adhesive film is on the image sensor. A transparent cover is on the adhesive film. The transparent cover includes a top surface, a first side surface and a second side surface disposed on the first side surface. The second side surface is inclined with respect to an extending direction of a bottom surface of the transparent cover. A mold layer covers an upper surface of the substrate, a side surface of the image sensor, aside surface of the adhesive film, the first side surface of the transparent cover and a partial portion of the second side surface of the transparent cover. A top surface of the mold layer is higher than a lower end of the second side surface and lower than the top surface of the transparent cover.

According to an embodiment of the present inventive concepts, an image sensor package includes a substrate. An image sensor is on the substrate. The image sensor includes a sensor array region, a logic region and a pad region. A wire electrically connects the substrate and the image sensor. An adhesive film is on the image sensor. The adhesive film is disposed in the logic region. A transparent cover is on the adhesive film. The transparent cover includes a top surface, a first side surface, a second side surface disposed on the first side surface and a stepped surface connecting the first side surface and the second side surface. The stepped surface overlaps the pad region in a vertical direction. A mold layer covers an upper surface of the substrate, a side surface of the image sensor, a side surface of the adhesive film, and the first side surface, the stepped surface and a partial portion of the second side surface of the transparent cover. A top surface of the mold layer is lower than the top surface of the transparent cover in a range of about 5 µm to about 50 µm.

According to an embodiment of the present inventive concepts, a method for manufacturing image sensor packages includes attaching an image sensor to an upper surface of a substrate. The substrate and the image sensor are connected by a wire. A transparent cover is provided on the image sensor. A coating layer is formed at a top surface of the transparent cover. A molding tape is provided that covers a partial portion of a side surface of the transparent cover and the coating layer. A mold layer is formed between the molding tape and the substrate. The molding tape is removed. The coating layer is removed. The substrate and the mold layer are cut to provide individualized image sensor packages.

According to an embodiment of the present inventive concepts, an image sensor package includes a substrate. An image sensor is on the substrate. An adhesive film is on the image sensor. A transparent cover is on the adhesive film. The transparent cover includes a top surface, a side surface and a bottom surface. At least a partial portion of the side surface includes an inclined surface that extends to the top surface of the transparent cover. The inclined surface is inclined with respect to an extending direction of the bottom surface of the transparent cover. A mold layer covers an upper surface of the substrate, a side surface of the image sensor, a side surface of the adhesive film, and a partial portion of the side surface of the transparent cover. An upper portion of the inclined surface is exposed by the mold layer.

DETAILED DESCRIPTION OF EMBODIMENTS

Figure 1:
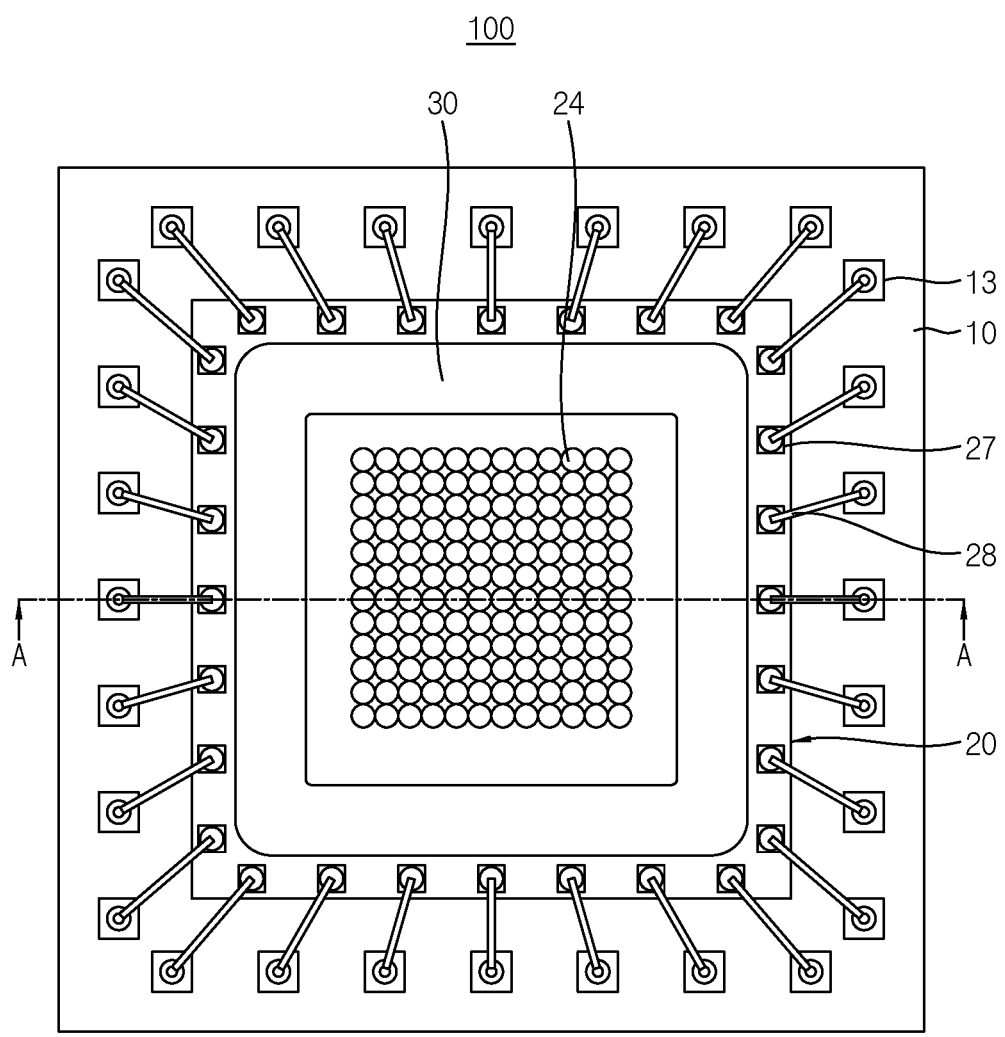
FIG. 1 is a plan view of an image sensor package according to an embodiment of the present inventive concepts.
Figure 2:
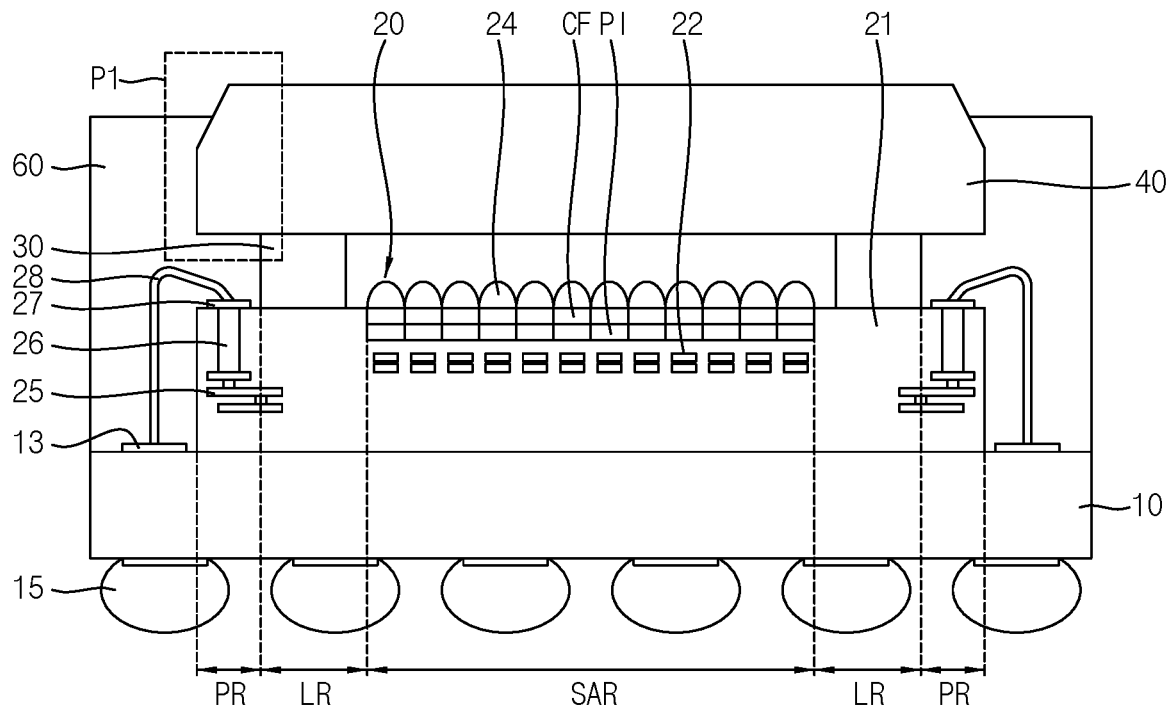
FIG. 2 is a cross-sectional view of the image sensor package according to an embodiment of the present inventive concepts.
Figure 3:
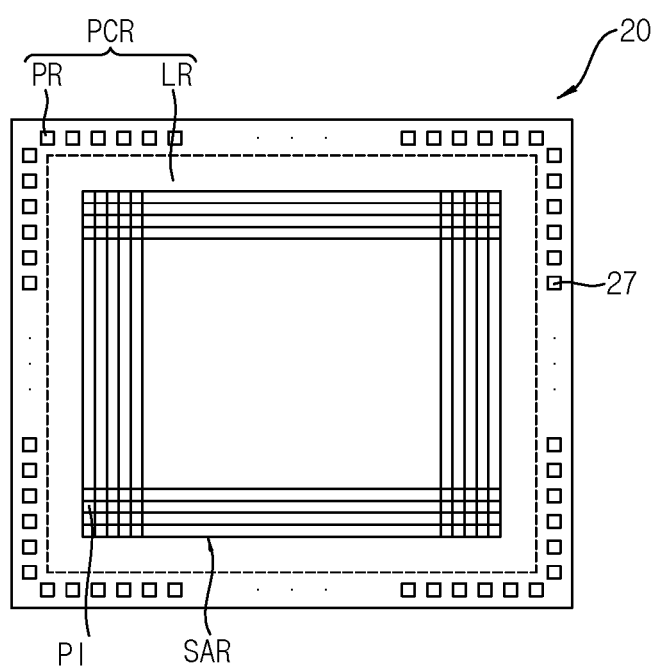
FIG. 3 is a top plan view of an image sensor according to in embodiment of the present inventive concepts.

FIG. 1 is a plan view of an image sensor package according to an embodiment of the present inventive concepts. FIG. 2 is a cross-sectional view of the image sensor package according to an embodiment of the present inventive concepts. FIG. 3 is a plan view of an image sensor.

Referring to the embodiments of FIGS. 1 and 2, an image sensor package 100 may include a substrate 10, connecting terminals 15, an image sensor 20, wires 28, an adhesive film 30, a transparent cover 40, and a mold layer 60.

In an embodiment, the substrate 10 may include various insulating materials such as plastic or ceramic. Conductive vias and wiring patterns may be disposed in the substrate 10. As shown in the embodiment of FIG. 2, connecting pads 13 may be disposed at upper and lower surfaces of the substrate 10 such that the connecting pads 13 may be electrically connected to corresponding ones of the conductive vias and the wiring patterns, respectively. As shown in the embodiment of FIG. 2, the connecting terminals 15 may be disposed at the lower surface of the substrate 10. The connecting terminals 15 may be disposed on corresponding ones of the connecting pads 13 that are disposed under the substrate 10, respectively. The connecting terminals 15 may be electrically connected to corresponding ones of the conductive vias and the wiring patterns in the substrate 10 through the corresponding connecting pads 13, respectively.

The image sensor 20 may be disposed on the substrate 10. For example, in an embodiment, the image sensor 20 may be a CMOS image sensor (CIS). In an embodiment, the image sensor 20 may be attached to the upper surface of the substrate 10 by means of an adhesive material. The image sensor 20 may include a semiconductor substrate 21. In an embodiment, the semiconductor substrate 21 may include silicon. However, embodiments of the present inventive concepts are not limited thereto. For example, the semiconductor substrate 21 may include a semiconductor element such as germanium (Ge) or a compound semiconductor such as silicon carbide (SiC), gallium arsenide (GaAs), indium arsenide (InAs) or indium phosphide (InP).

Referring to the embodiments of FIGS. 2 and 3, the image sensor 20 may include a sensor array region SAR, a logic region LR, and a pad region PR. The sensor array region SAR may include a plurality of unit pixels PI disposed in a matrix. For example, in an embodiment, each unit pixel PI may include a photoelectric converter, and a plurality of transistors for transferring and processing signals received from the photoelectric converter. As shown in the embodiment of FIG. 2, a color filter CF and a microlens 24 may be disposed on each unit pixel PI. Wiring patterns 22 may be disposed under the unit pixels PI, respectively. The logic region LR may be disposed along an edge of the sensor array region SAR. For example, as shown in the embodiment of FIG. 3, the logic region LR may be disposed along outer edges of the sensor array region SAR to completely surround the sensor array region SAR in a top view. The logic region LR may include electronic elements including a plurality of transistors. In an embodiment, the electronic elements may provide a predetermined signal to respective unit pixels PI of the sensor array region SAR, or may control output signals from respective unit pixels PI. The pad region PR may be disposed along an edge of the logic region LR. For example, as shown in the embodiment of FIG. 3, the pad region PR, may be disposed along outer edges of the logic region LR that are opposite to inner edges of the logic region LR which are adjacent to the sensor array region SAR. The pad region PR may completely surround the logic region LR in a top view. A plurality of lines 25, a plurality of through-silicon vias (TSVs) 26 and a plurality of connecting pads 27, which are used to send and receive electrical signals to and from the substrate 10, a may be disposed in the pad region PR.

Again referring to the embodiments of FIGS. 1 and 2, the image sensor 20 and the substrate 10 may be electrically interconnected through wire bonding. The wires 28 may be connected to respective connecting pads 27 of the image sensor 20 and respective connecting pads 13 of the substrate 10. The wires 28 may electrically connect the image sensor 20 and the substrate 10 to each other in an embodiment, the wires 28 may be metal wires made of metal such as gold or copper. However, embodiments of the present inventive concepts are not limited thereto.

A transparent cover 40 may be disposed on the image sensor 20. In an embodiment, the transparent cover 40 may perform a function of protecting an upper portion the image sensor 20 while transferring external light, that is, an image signal, to the sensor array region SAR of the image sensor 20. For example, in an embodiment, the transparent cover 40 may be glass. In an embodiment, the transparent cover 40 may be fixed to the image sensor 20 by the adhesive film 30. The adhesive film 30 may be interposed between the image sensor 20 and the transparent cover 40 (e.g., in a vertical direction that may be parallel to a thickness direction of the substrate 10). The transparent cover 40 may be spaced apart from the image sensor 20 a predetermined distance by the adhesive film 30. The adhesive film 30 may be disposed along an edge of the image sensor 20. For example, when viewed in a top view, the adhesive film 30 may surround the sensor array region SAR, and may be disposed in the logic region LR. For example, in an embodiment, the adhesive film 30 may fully surround the sensor array region SAR in the top view. In an embodiment, the adhesive film 30 may include a photosensitive adhesive polymer or a thermosetting polymer. For example, the adhesive film 30 may include an epoxy-based mixture. In an embodiment, the adhesive film 30 may have a width in a range of about 500 to about 700 μm and a height of about 100 to about 200 μm.

The mold layer 60 may cover at least a partial portion of each of the image sensor 20, the adhesive film 30 and the transparent cover 40. For example, the mold layer 60 may cover an exposed upper surface of the substrate 10, a side surface of the image sensor 20, a portion of at upper surface of the image sensor 20, an outer side surface of the adhesive film 30, and a partial portion of a side surface of the transparent cover 40. The mold layer 60 may expose a portion of the transparent cover 40.

Figure 4:
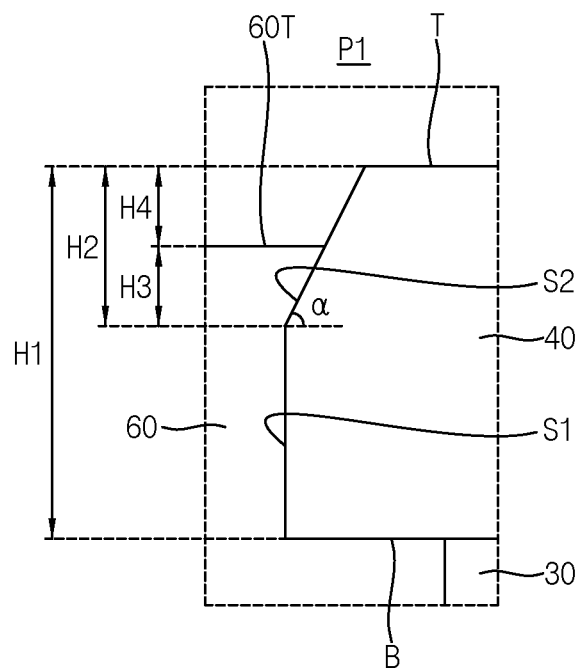
FIG. 4 is an enlarged view of region P1 in FIG. 2 according to an embodiment of the present inventive concepts.

FIG. 4 is an enlarged view of a region P1 in FIG. 2 according to an embodiment of the present inventive concepts.

Referring to the embodiments of FIGS. 2 and 4, a height H1 (e.g., length in a vertical direction that may be parallel to a thickness direction of the substrate 10) of the transparent cover 40 may be in a range of about 200 to about 500 μm. The transparent cover 40 may include a first side surface S1 and a second side surface S2 that is disposed on the first side surface S1. For example, as shown in the embodiments of FIGS. 2 and 4, the first side surface S1 may be directly connected to a bottom surface B of the transparent cover 40, and may be substantially perpendicular to the upper surface of the substrate 10. The second side surface S2 may be disposed on the first side surface S1, may be directly connected to an upper end of the first side surface S1, and may be directly connected to a top surface T of the transparent cover 40. The second side surface S2 may be inclined with respect to the upper surface of the substrate 10. For example, the second side surface S2 may extend at an oblique angle with respect to an upper portion of the first side surface S1 and may be inclined with respect to an extending direction of the bottom surface B of the transparent cover 40. As shown in the embodiment of FIG. 2, the bottom surface B of the transparent cover 40 may extend in a direction substantially parallel to an upper surface of the substrate 10. An angle α formed by the inclined second side surface S2 and a horizontal line passing through a lower end of the second side surface S2 which may be parallel to an extending direction of the bottom surface B may be in a range of about 45° to about 90°. As such, an inclination angle of the second side surface S2 with respect to the bottom surface B of the transparent cover 40 may be in a range of about 45° to about 90°.

A height H2 of the second side surface S2 may be about half of the total height H1 of the transparent cover 40. The height H2 of the second side surface may refer to a distance in a vertical direction (e.g., a direction parallel to a thickness direction of the substrate 10) from a top surface of the first side surface S1. As shown in the embodiment of FIG. 4, a height of the first side surface S1 may be substantially equal to the height H2 of the second side surface S2. The height of the first side surface S1 may be the height of the second side surface H2 subtracted from the height H1 of the transparent cover 40 (e.g., H1-H2). For example, each of the height of the first side surface S1 and the height H2 of the second side surface S2 may be in a range of about 100 to about 250 μm. The height H2 of the second side surface S2 may mean a minimum distance between the horizontal line passing through the lower end of the second side surface S2 and a horizontal line passing through an upper end of the second side surface S2.

As shown in the embodiment of FIG. 4, the mold layer 60 may completely cover the first side surface S1 while only partially covering the second side surface S2. For example, the mold layer 60 may expose a portion of the second side surface S2, such as an upper portion of the second side surface S2. A top surface 60T of the mold layer 60 may be disposed between the lower end of the second side surface S2 and the upper surface of the second side surface S2 (e.g., the top surface T of the transparent cover 40). For example, the top surface 60T of the mold layer 60 may be lower than the top surface T of the transparent cover 40 and the upper surface of the second side surface S2. In art embodiment, the top surface 60T of the mold layer 60 may be disposed at an intermediate level between the lower end of the second side surface S2 and the top surface T of the transparent cover 40. The intermediate level is the mid-point between the lower end of the second side surface S2 and the top surface T of the transparent cover 40 (e.g., the tipper end of the second side surface S2) in the vertical direction. For example, as shown in the embodiment of FIG. 4, a height H3 of the partial portion of the second side surface S2 covered by the mold layer 60 and a height H4 (e.g., length in a thickness direction of the substrate 10) of a partial portion of the second side surface S2 not covered (e.g., exposed) by the mold layer 60 may be substantially equal to each other. The height H3 of the partial portion of the second side surface S2 covered by the mold layer 60 may be a distance in the vertical direction from a top surface of the first side surface S1 to a top surface 60T of the mold layer. The height H4 of the partial portion of the second side surface not covered (e.g, exposed) by the mold layer 60 may be a distance in the vertical direction from the top surface 60T of the mold layer 60 to a top surface of the transparent cover 40.

Figure 5:
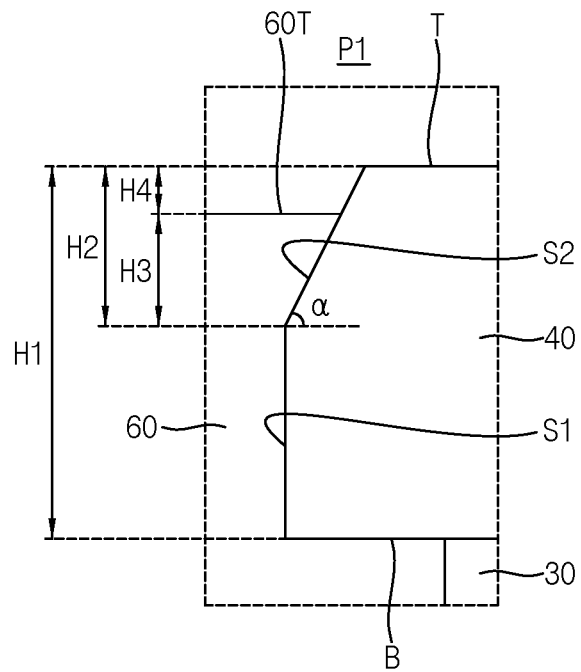
FIG. 5 is an enlarged view of region P1 in FIG. 2 according to an embodiment of the present inventive concepts.

FIG. 5 is an enlarged view of the region P1 in FIG. 2 according to an embodiment of the present inventive concepts.

Referring to the embodiment of FIG. 5, the top surface 60T of the mold layer 60 may be disposed at a higher level than an intermediate level between the lower end of the second side surface S2 and the top surface T of the transparent cover 40. For example, the height H3 of the partial portion of the second side surface S2 covered b the mold layer 60 may be greater than the height H4 of the partial portion of the second side surface S2 not covered by the mold layer 60. For example, the height H4 of the partial portion of the second side surface S2 not covered by the mold layer 60 may be in a range of about 5 to about 50 μm.

Figure 6:
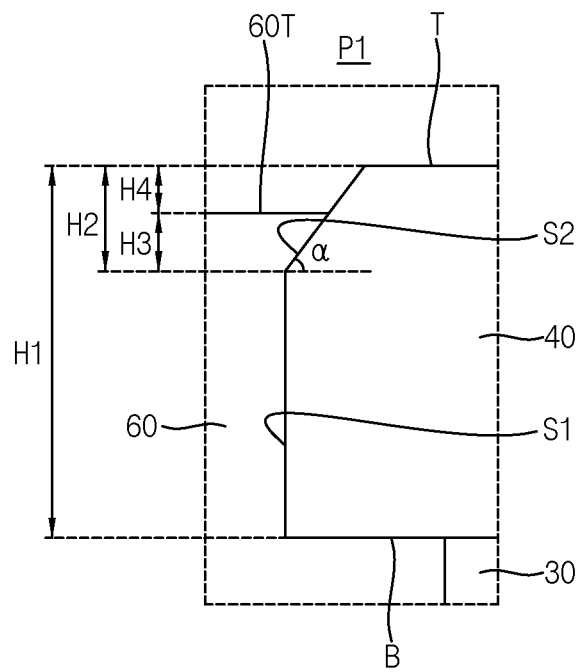
FIG. 6 is an enlarged view of region P1 in FIG. 2 according to an embodiment of the present inventive concepts.
Figure 7:
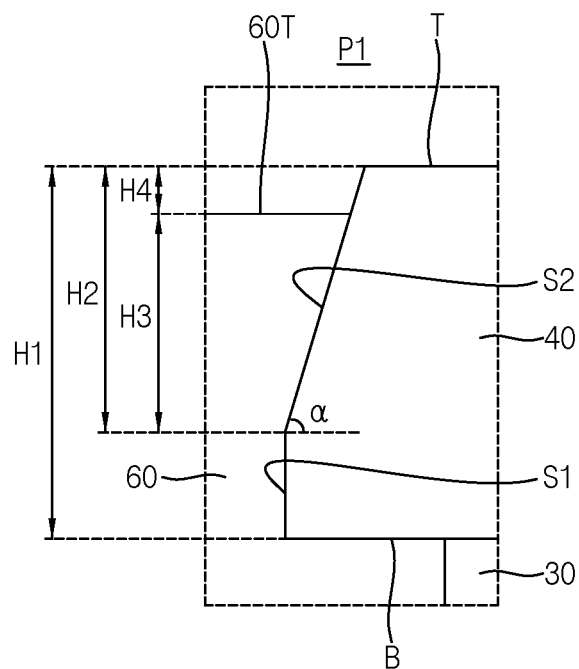
FIG. 7 is an enlarged view of region P1 in FIG. 2 according to an embodiment of the present inventive concepts.

FIG. 6 is an enlarged view of the region P1 in FIG. 2 according to an embodiment of the present inventive concepts. FIG. 7 is an enlarged view of the region P1 in FIG. 2 according to an embodiment of the present inventive concepts.

Referring to the embodiments of FIGS. 6 and 7, the first side surface S1 and the second side surface S2 may have different heights from each other. Referring to the embodiment of FIG. 6, the height H2 of the second side surface S2 may be less than the height of the first side surface S1. Referring to the embodiment of FIG. 7, the height H2 of the second side surface S2 may be greater than the height of the first side surface S1. Even in embodiments in which the first side surface S1 and the second side surface S2 have different heights from each other, the top surface 60T of the mold layer 60 may be disposed at a level that is greater than or equal to an intermediate level between the lower end of the second side surface S2 and the top surface of the transparent cover 40.

Figure 8:
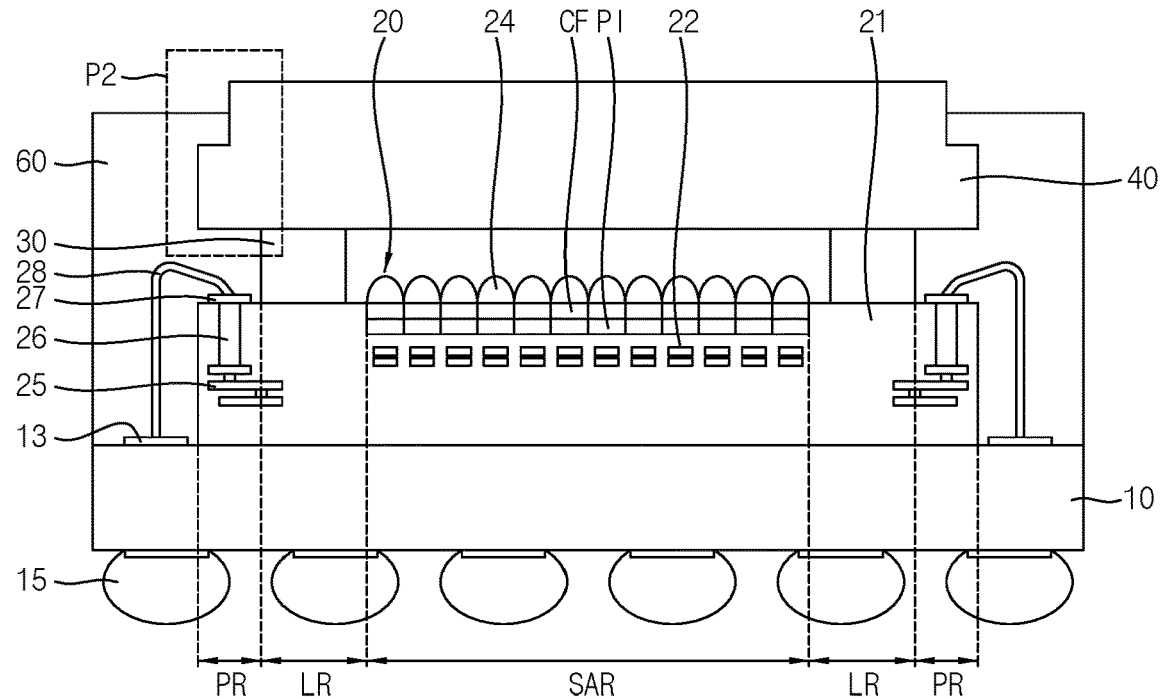
FIG. 8 is a cross-sectional view of an image sensor package according to an embodiment of the present inventive concepts.
Figure 9:
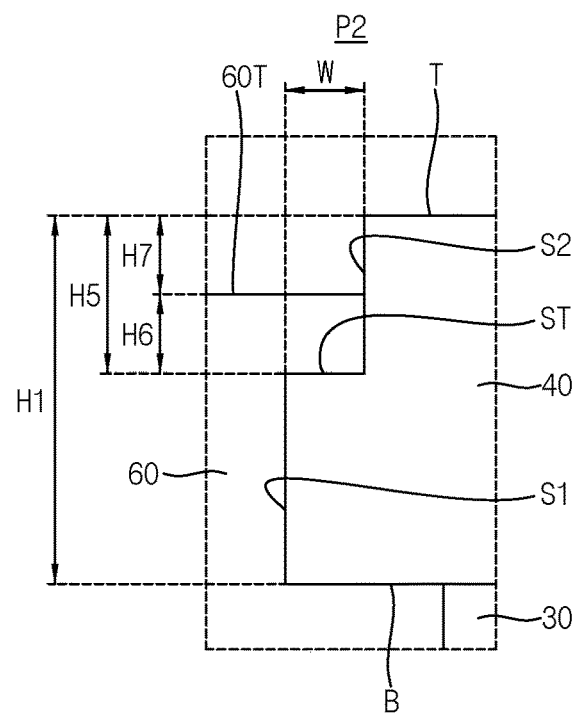
FIG. 9 is an enlarged view of region P2 in FIG. 8 according to an embodiment of the present inventive concepts.

FIG. 8 is a cross-sectional view of an image sensor package according to an embodiment of the present inventive concepts. FIG. 9 is an enlarged view of a region P2 in FIG. 8.

Referring to the embodiments of FIGS. 8 and 9, a transparent cover 40 of an image sensor package 200 may have a step at a portion of an edge thereof. The transparent cover 40 may include a first side surface S1, a second side surface S2 and a stepped surface ST disposed therebetween. The first side surface S1 is directly connected to a bottom surface B of the transparent cover 40. The second side surface S2 is directly connected to a top surface T of the transparent cover 40. The stepped surface ST connects the first side surface S1 and the second side surface S2. As shown in the embodiment of FIG. 8, the stepped surface ST may overlap with a pad region PR of an image sensor 20 in the vertical direction which may be substantially parallel to the thickness direction of the substrate 10.

The mold layer 60 may completely cover the first side surface S1 and the stepped surface ST while partially covering the second side surface S2. In an embodiment a height H6 (e.g., length in a thickness direction of the substrate 10) of the mold layer 60 from the stepped surface ST to a top surface 60T of the mold layer 60 may be greater than or equal to about half of a height H5 of the second side surface S2. For example, in an embodiment, the top surface 60T of the mold layer 60 may be disposed at a level that is greater than or equal to the intermediate level between a lower end of the second side surface S2 and an upper surface of the second side surface S2 (e.g., the top surface T of the transparent cover 40). As such, a height H6 of the partial portion of the second side surface S2 covered by the mold layer 60 may be greater than or equal to a height H7 of the partial portion of the second side surface S2 not covered by (e.g, exposed by) the mold layer 60. In an embodiment, the height H7 of the partial portion of the second side surface S2 not covered by the mold layer 60 may be in a range of about 5 to about 50 μm. For example, the second side surface S2 may be lower than the top surface of the transparent cover 40 in a range of about 5 μm to about 50 μm. A width W of the stepped surface ST (e.g., length in the extending direction of the bottom surface of the transparent cover 40) may be in a range of about 5 μm to about 20 μm.

In an embodiment, a height of the first side surface S1 may be substantially equal to the height H5 of the second side surface S2. However, embodiments of the present inventive concepts are trot limited thereto. For example, the height of the first side surface S1 may be greater or smaller than the height H5 of the second side surface S2.

Figure 10:
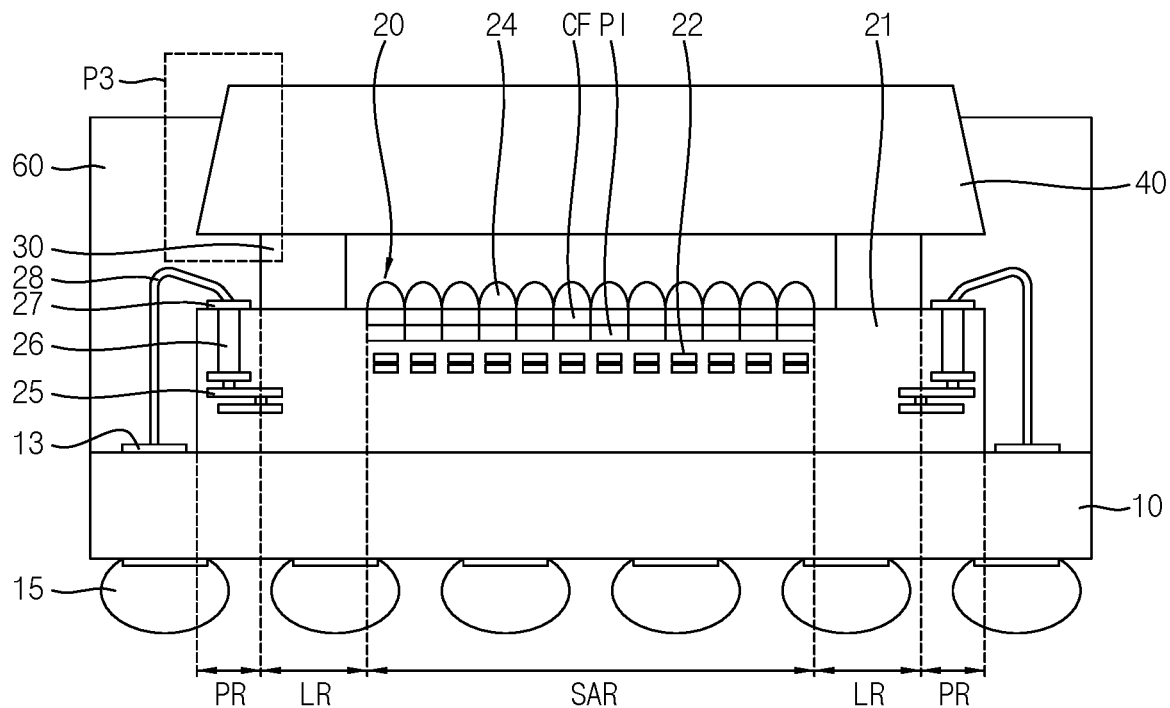
FIG. 10 is a cross-sectional view of an image sensor package according to an embodiment of the present inventive concepts.
Figure 11:
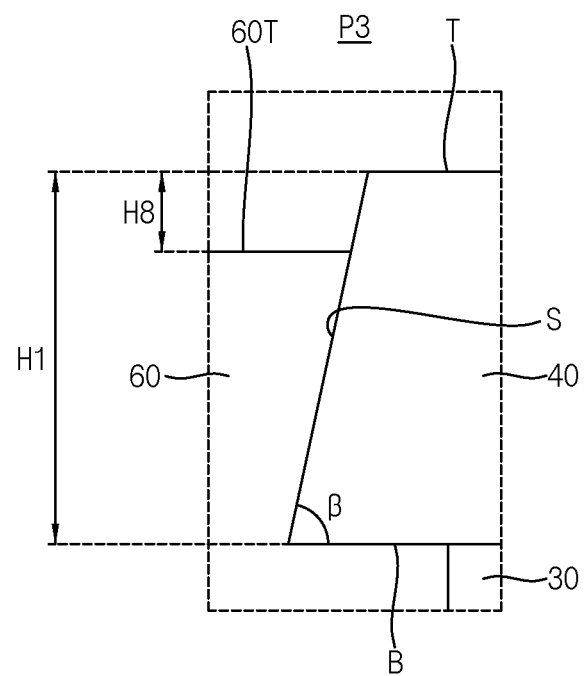
FIG. 11 is an enlarged view of region P3 in FIG. 10 according to an embodiment of the present inventive concepts.

FIG. 10 is a cross-sectional view of an image sensor package according to an embodiment of the present inventive concepts. FIG. 11 is an enlarged view of a region P3 in FIG. 10.

Referring to the embodiments of FIGS. 10 and 11, a side surface S of a transparent cover 40 included in an image sensor package 300 may be inclined with respect to an upper surface of a substrate 10. For example, as shown in the embodiment of FIG. 10, an entire portion of the side surface S of the transparent cover 40 may be inclined with respect to an extending direction of the bottom surface B of the transparent cover 40. For example, in an embodiment, an inclination angle β formed by the side surface S of the transparent cover 40 and the bottom surface B of the transparent cover 40 may be in a range of about 45 to about 90°. A mold layer 60 may partially cover the side surface S of the transparent cover 40 while partially exposing a partial portion of the side surface S. In an embodiment, a height H8 of the partial portion of the side surface S of the transparent cover 40 exposed by the mold layer 60 may be in a range of about 5 to about 50 μm.

When the transparent cover 40 has an inclined side surface or a stepped side surface, as described above, the contact area between the mold layer 60 and the transparent cover 40 may increase, and a force of the mold layer 60 to fix the transparent cover 40 may increase because the mold layer 60 is disposed to extend up to a level higher than a predetermined portion of the side surface of the transparent cover 40. As such, it may be possible to avoid an interface peel-off phenomenon occurring between the mold layer 60 and the transparent cover 40 caused by air expansion generated in a thermal process. In addition, as the top surface of the mold layer 60 is formed to be lower than the top surface of the transparent cover 40, the creation of mold flash, which is a residual of the mold layer 60, on the transparent cover 40 may be prevented.

FIGS. 12 to 19 are cross-sectional views explaining a method for manufacturing an image sensor package in accordance with embodiments of the present inventive concepts.

Figure 12:
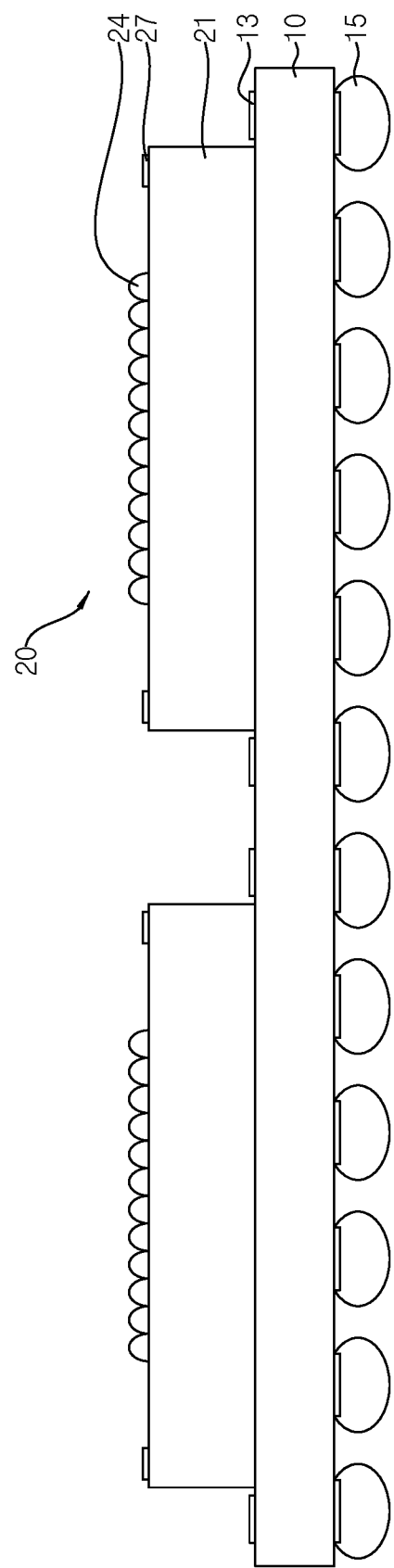
FIGS. 12 to 19 are cross-sectional views illustrating a method for manufacturing an image sensor package according to an embodiment of the present inventive concepts.

Referring to the embodiment of FIG. 12, the method may include providing a substrate 10. In an embodiment, the substrate 10 may be made of various insulating materials such as plastic and ceramic. Conductive vias or a plurality of conductive circuit patterns may be disposed in the substrate 10. Connecting pads 13 may be disposed at upper and lower surface of the substrate 10. For example, in an embodiment, the substrate 10 may be a printed circuit board. Connecting terminals 15 may be formed at the connecting pads 13 disposed at the lower surface of the substrate 10, respectively. In an embodiment, the connecting terminals 15 may be formed after a mold layer formation process which will be described in conjunction with FIG. 17.

The method may include attaching an image sensor 20 to the upper surface of the substrate 10. For example, the image sensor 20 may be attached to the upper surface of the substrate 10 using an adhesive film such as a double-sided tape. Referring to the embodiment of FIG. 12 together with the embodiment of FIG. 2, the image sensor 20 may include a sensor array region SAR in which unit pixels PI and microlenses 24 are disposed, a pad region in which connecting pads 27 are disposed, and a logic region LR disposed between the sensor array region SAR and the pad region PR.

Figure 13:
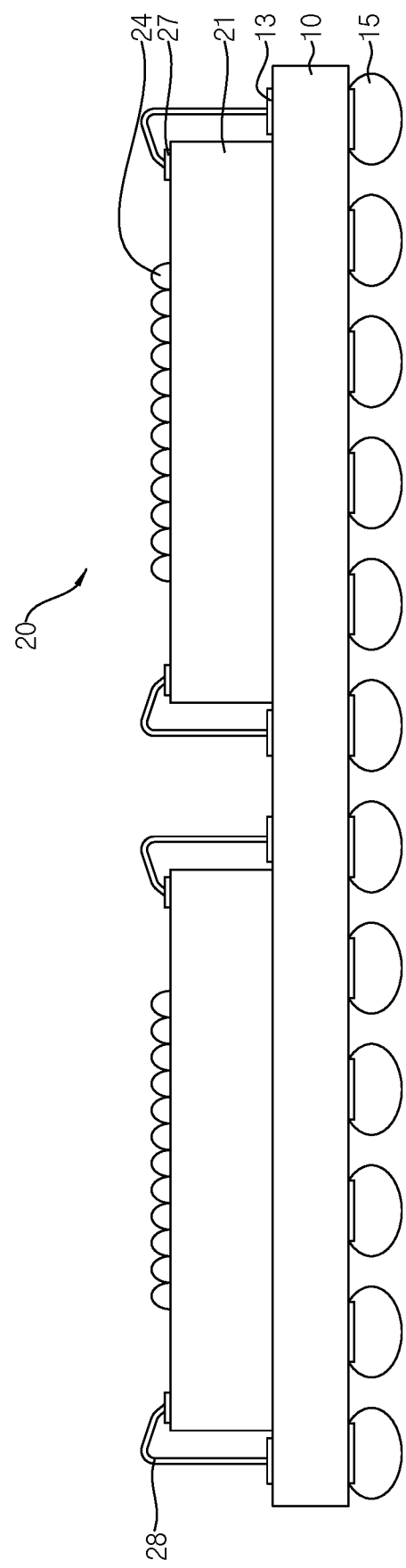

Referring to the embodiment of FIG. 13, the method may include connecting the connecting pads 13 of the substrate 10 and the connecting pads 27 of the image sensor 20 through a wire bonding process, respectively. For example, one end of a wire 28 may be connected to one of the connecting pads 13 of the substrate 10 and the other end of the wire 28 may be connected to a corresponding one of the connecting pads 27 of the image sensor 20.

Figure 14:
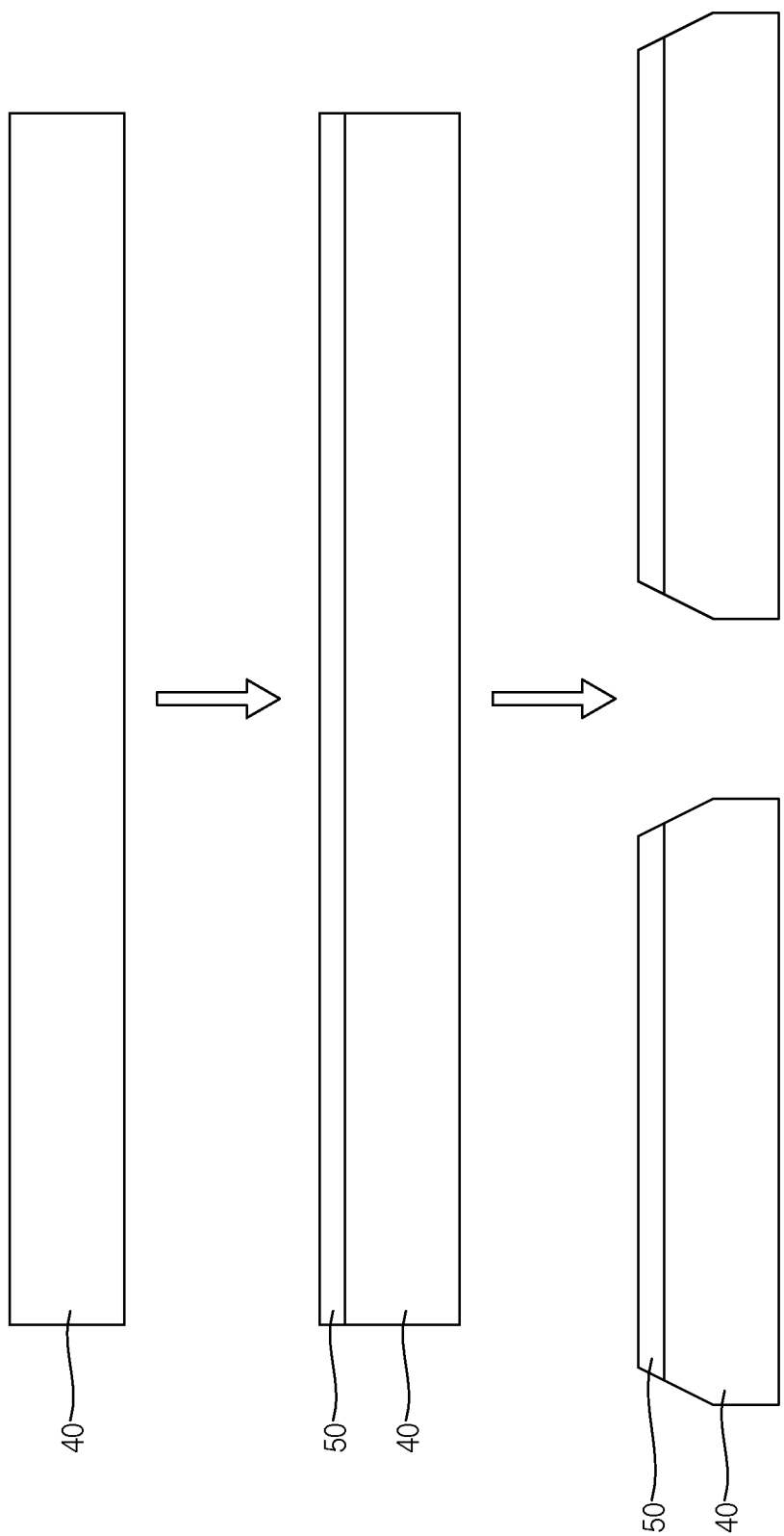

Referring to the embodiment of FIG. 14, the method may include forming a coating layer 50 on a top surface of the transparent cover 40. For example, a coating material coverings the upper surface of the substrate 10 may be formed to a predetermined thickness through a coating process. In an embodiment, the coating material may include a urethane-based material. In an embodiment, the thickness of the coating layer may be in a range of about 2 μm to about 5 μm.

Thereafter, the method may include cutting the transparent cover 40 formed with the coating layer. Cutting of the transparent cover 40 may include forming an inclined surface at a side surface of the transparent cover 40 using a cutting member having an inclined surface. In an embodiment, the cutting of the transparent cover 40 may include forming a step at an edge of the transparent cover 40.

Figure 15:
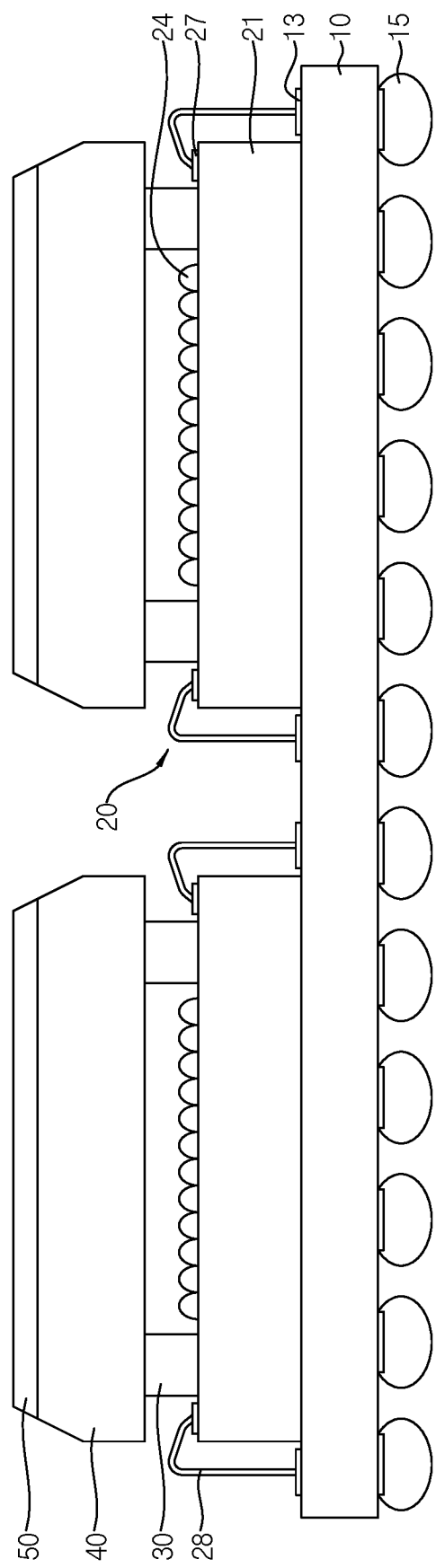

Referring to the embodiment of FIG. 15, the method may include attaching the transparent cover 40 to a top surface of the image sensor 20 using an adhesive film 30. Referring to the embodiments of FIGS. 2 and 15, the adhesive film 30 may be disposed between the sensor array region SAR and the pad region PR. For example, the adhesive film 30 may be disposed to overlap with the logic region LR. In an embodiment, the adhesive film 30 may include a photosensitive adhesive polymer and/or a thermosetting polymer. The transparent cover 40 may be fixed to an upper surface of the adhesive film 30 by the adhesive film 30. The transparent cover 40 may overlap with the entire portion of the top surface of the image sensor 20. In an embodiment, an inclined surface of a side surface of the transparent cover 40 may be vertically overlapped with the pad region PR.

In an embodiment, the coating process and the cutting process for the transparent cover 40, which are described in conjunction with FIG. 14, may be carried out after attachment of the transparent cover 40 to the top surface of the image sensor 20.

Figure 16:
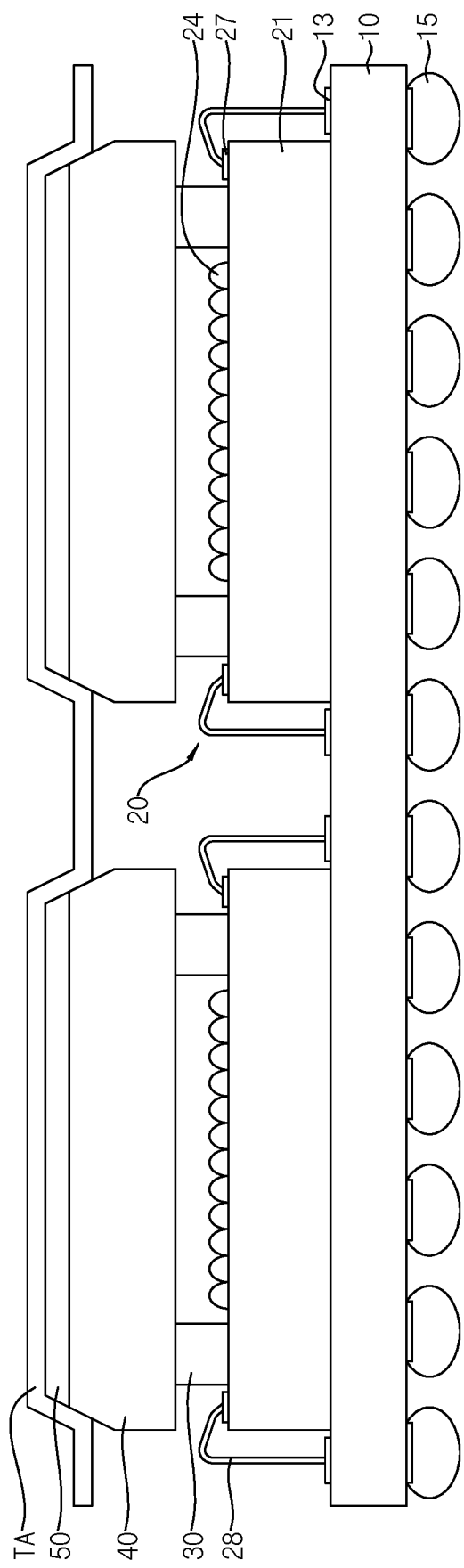
Figure 17:
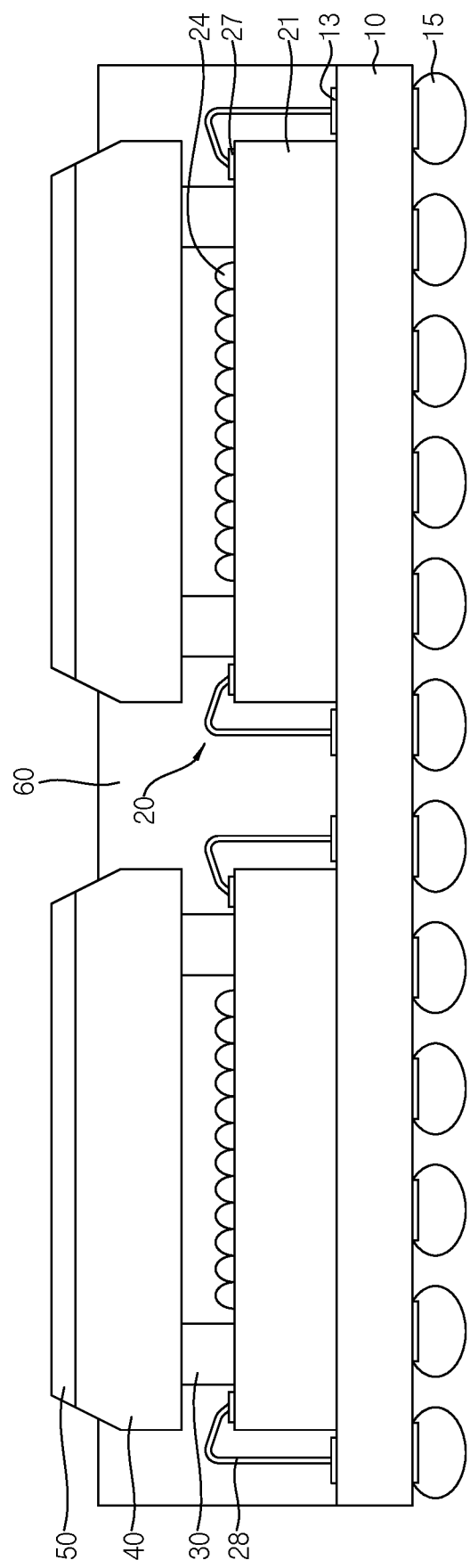

Referring to the embodiments of FIGS. 16 and 17, the method may include forming a mold layer 60. The formation of the mold layer 60 may include forming a molding tape TA covering a portion of the inclined surface of the transparent cover 40. For example, the molding tape TA may cover the partial portion of the inclined surface of the transparent cover 40 that will not be covered by (e.g., will be exposed by) the molding layer 60. An encapsulation resin may then be filled between the substrate 10 and the molding tape TA, thereby forming the mold layer 60. For example, the formation of the mold layer 60 may be achieved by molding an epoxy molding compound (EMC), and curing the molded EMC. In comparative embodiments, there may be a problem in that the mold layer 60 creates mold flash covering the top surface of the transparent cover 40 due to interface peel-off occurring between the molding tape TA and the transparent cover 40 during a process of forming the mold layer 60. However, in an embodiment of the present inventive concepts, the transparent cover 40, which is covered by the coating layer 50 at the top surface thereof, is used and, as such, creation of mold flash in the process of forming the mold layer 60 may be avoided. After formation of the mold layer 60, the molding tape TA may be removed. For example, the molding tape TA may be removed through a heating process.

Figure 18:
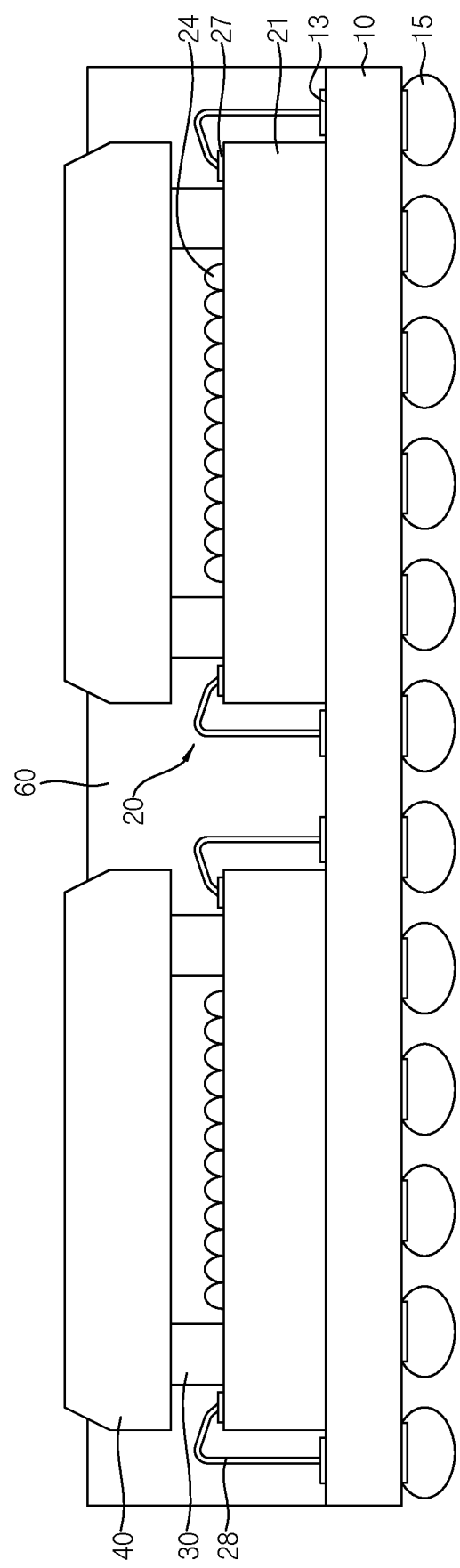

Referring to the embodiment of FIG. 18, the method may include removing the coating layer 50.

Figure 19:
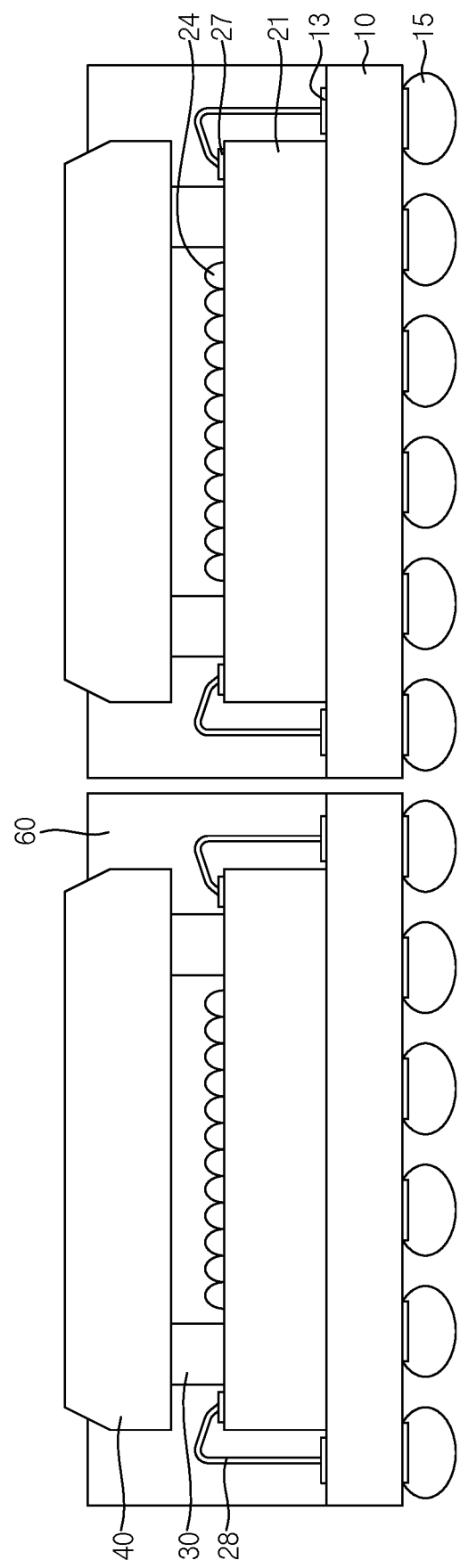

Referring to the embodiment of FIG. 19, the method may include a process of separating the substrate 10 and the mold layer 60 from each other, thereby individualizing image sensor packages.

As apparent from the above description, in accordance with embodiments of the present inventive concepts, a transparent cover having an inclined surface at an edge thereof is used in an image sensor package and, as such, the contact area between a molding layer and the transparent cover may be increased to enable the mold layer to fix the edge of the transparent cover. Accordingly, an interlace peel-off phenomenon occurring between the molding layer and the transparent cover may be avoided. As a coating layer may be formed on the transparent cover in an image sensor package manufacturing process, formation of mold flash, foreign matter, scratches, etc. on the transparent cover may be prevented.

While embodiments of the present inventive concepts have been described with reference to the accompanying drawings, it should be understood by those skilled in the art that various modifications may be made without departing from the scope of the present inventive concepts and without changing essential features thereof. Therefore, the above-described embodiments should be considered in a descriptive sense only and not for purposes of limitation.

What is claimed is:

1. An image sensor package comprising:
a substrate;
an image sensor on the substrate;
an adhesive film on the image sensor;
a transparent cover on the adhesive film, the transparent cover comprising a top surface, a first side surface and a second side surface disposed on the first side surface, the second side surface is inclined with respect to an extending direction of a bottom surface of the transparent cover; and
a mold layer covering an upper surface of the substrate, a side surface of the image sensor, a side surface of the adhesive film, the first side surface of the transparent cover and a partial portion of the second side surface of the transparent cover,
wherein a top surface of the mold layer is higher than a lower end of the second side surface and lower than the top surface of the transparent cover,
wherein a height of the second side surface is in a range of 100 µm to 250 µm.

2. The image sensor package according to claim 1, wherein a level of the top surface of the mold layer is greater than or equal to an intermediate level between the lower end of the second side surface and the top surface of the transparent cover.

3. The image sensor package according to claim 1, wherein the top surface of the mold layer is lower than the top surface of the transparent cover in a range of 5 µm to 50 µm.

4. The image sensor package according to claim 1, wherein a height of the first side surface and a height of the second side surface are equal.

5. The image sensor package according to claim 1, wherein a height of the first side surface is greater than a height of the second side surface.

6. The image sensor package according to claim 1, wherein a height of the first side surface is less than a height of the second side surface.

7. The image sensor package according to claim 1, wherein the second side surface is inclined with respect to the extending direction of a bottom surface of the transparent cover in a range of 45° to 90°.

8. The image sensor package of claim 1, wherein:
a height of the transparent cover is in a range of 200 µm to 500 µm; and
a height of the adhesive film is in a range of 100 µm to 200 µm.

9. An image sensor package comprising:
a substrate;
an image sensor on the substrate, the image sensor comprising a sensor array region, a logic region and a pad region;
a wire electrically connecting the substrate and the image sensor;
an adhesive film on the image sensor, the adhesive film is disposed in the logic region;
a transparent cover on the adhesive film, the transparent cover comprising a top surface, a first side surface, a second side surface disposed on the first side surface and a stepped surface connecting the first side surface and the second side surface, the stepped surface overlaps the pad region in a vertical direction; and
a mold layer covering an upper surface of the substrate, a side surface of the image sensor, a side surface of the adhesive film, and the first side surface, the stepped surface and a partial portion of the second side surface of the transparent cover,
wherein a top surface of the mold layer is lower than the top surface of the transparent cover in a range of 5 µm to 50 µm.

10. The image sensor package according to claim 9, wherein a width of the stepped surface is in a range of 5 µm to 20 µm.

11. The image sensor package according to claim 9, wherein a level of the top surface of the mold layer is greater than or equal to an intermediate level between the stepped surface and the top surface of the transparent cover.

12. The image sensor package according to claim 9, wherein a height of the first side surface and a height of the second side surface are substantially equal.

13. The image sensor package according to claim 9, wherein a height of the first side surface is greater than a height of the second side surface.

14. The image sensor package according to claim 9, wherein a height of the first side surface is less than a height of the second side surface.

15. The image sensor package according to claim 9, wherein the mold layer comprises an epoxy molding compound (EMC).

16. An image sensor package comprising:
a substrate;
an image sensor on the substrate;
an adhesive film on the image sensor,
a transparent cover on the adhesive film, the transparent cover comprising a top surface, a side surface and a bottom surface,
at least a partial portion of the side surface includes an inclined surface that extends to the top surface of the transparent cover, the inclined surface is inclined with respect to an extending direction of the bottom surface of the transparent cover,
a mold layer covering an upper surface of the substrate, a side surface of the image sensor, a side surface of the adhesive film, and a partial portion of the side surface of the transparent cover, wherein an upper portion of the inclined surface is exposed by the mold layer,
wherein a top surface of the mold layer is lower than a top surface of the transparent cover in a range of 5 μm to 50 μm.

17. The image sensor package of claim 16, wherein an entire portion of the side surface includes the inclined surface.

18. The image sensor package of claim 16, wherein the side surface includes a lower portion disposed below the inclined surface, the lower portion is orthogonal with respect to the extending direction of the bottom surface of the transparent cover.

* * * * *